United States Patent
Brosch

(10) Patent No.: US 10,756,757 B2
(45) Date of Patent: Aug. 25, 2020

(54) MAINTAINING DATA DEDUPLICATION REFERENCE INFORMATION

(71) Applicant: Dell Products L.P., Round Rock, TX (US)

(72) Inventor: Ryan W. Brosch, Arden Hills, MN (US)

(73) Assignee: Dell Products L.P., Round Rock, TX (US)

( * ) Notice: Subject to any disclaimer, the term of this patent is extended or adjusted under 35 U.S.C. 154(b) by 643 days.

(21) Appl. No.: 15/173,323

(22) Filed: Jun. 3, 2016

(65) Prior Publication Data
US 2017/0351697 A1    Dec. 7, 2017

(51) Int. Cl.
  *H03M 7/30*    (2006.01)
  *G06F 16/22*   (2019.01)
  *G06F 3/06*    (2006.01)

(52) U.S. Cl.
  CPC ...... *H03M 7/3091* (2013.01); *G06F 16/2272* (2019.01); *G06F 3/06* (2013.01)

(58) Field of Classification Search
  CPC ............. G06F 16/2246; G06F 16/2272; G06F 16/2358; G06F 16/2372; G06F 3/06; H03M 7/3091
  See application file for complete search history.

(56) References Cited

U.S. PATENT DOCUMENTS

| | | | | |
|---|---|---|---|---|
| 8,200,700 B2 * | 6/2012 | Moore | ............. | G06F 17/30575 707/791 |
| 8,423,520 B2 * | 4/2013 | Rao | ..................... | G06F 16/1744 707/693 |
| 8,521,705 B2 * | 8/2013 | Jayaraman | ............ | G06F 3/0641 707/692 |
| 8,862,559 B2 * | 10/2014 | Jayaraman | ........ | G06F 17/30156 707/693 |
| 9,037,544 B1 * | 5/2015 | Zheng | .................... | G06F 3/0619 707/639 |
| 9,830,342 B2 * | 11/2017 | Dolph | ................. | G06F 16/2365 |
| 10,102,144 B2 * | 10/2018 | Sundararaman | .... | G06F 12/0269 |
| 2006/0004840 A1 * | 1/2006 | Senda | ............... | G06F 17/30336 |

(Continued)

OTHER PUBLICATIONS

Spillane et al.; "An Efficient Multi-Tier Tablet Server Storage Architecture," 2nd ACM Symposium on Cloud Computing (SOCC 2011 ) (Year: 2011).*

*Primary Examiner* — Ashish Thomas
*Assistant Examiner* — Mellissa M. Ohba
(74) *Attorney, Agent, or Firm* — Jackson Walker L.L.P.

(57) ABSTRACT

A data deduplication method includes detecting a deduplication transaction including a data pattern associated with a data pattern address (DPA) and a reference, to the pattern, associated with a data reference address (DRA). A deduplication key may be determined based on the DPA and the DRA by concatenating the DPA and the DRA with the DPA as the most significant bits. The key may be stored in a key field of a record in a persistent and sequentially-accessed log, which is part of a log-with-index (LWI) structure that also maintains, in RAM or SSD, a binary index of the log records. When full, the log is cleared by writing the records in key-sorted order to the new tablet. From time to time, two tablets in the tablet library are merged. Tablet merging may include two or more atomic merges, each atomic merge corresponding to a portion of the tablet.

17 Claims, 5 Drawing Sheets

LOGICAL STRUCTURE OF BACKREFERENCE KEYS

(56) References Cited

U.S. PATENT DOCUMENTS

| | | | |
|---|---|---|---|
| 2008/0005145 A1* | 1/2008 | Worrall | G06F 17/30233 |
| 2009/0031096 A1* | 1/2009 | Smith | G06F 11/2092 |
| | | | 711/162 |
| 2012/0072656 A1* | 3/2012 | Archak | G06F 12/0802 |
| | | | 711/104 |
| 2013/0006997 A1* | 1/2013 | Asayama | G06F 17/30336 |
| | | | 707/740 |
| 2013/0246372 A1* | 9/2013 | Rao | G06F 16/1744 |
| | | | 707/692 |
| 2013/0346725 A1* | 12/2013 | Lomet | G06F 12/10 |
| | | | 711/206 |
| 2014/0258244 A1* | 9/2014 | Rao | G06F 16/1724 |
| | | | 707/692 |
| 2014/0337338 A1* | 11/2014 | Shinn | G06F 17/30312 |
| | | | 707/737 |
| 2015/0134616 A1* | 5/2015 | Zheng | G06F 3/0619 |
| | | | 707/639 |
| 2016/0162508 A1* | 6/2016 | Brosch | G06F 17/30156 |
| | | | 707/692 |
| 2016/0196320 A1* | 7/2016 | Borowiec | G06F 11/1451 |
| | | | 707/624 |
| 2017/0032013 A1* | 2/2017 | Zheng | G06F 16/275 |
| 2017/0193041 A1* | 7/2017 | Fuchs | G06F 17/30442 |
| 2017/0235496 A1* | 8/2017 | Brosch | G06F 3/0608 |
| | | | 707/692 |
| 2017/0351731 A1* | 12/2017 | Brosch | G06F 16/2372 |

* cited by examiner

MAINTAINING DATA DEDUPLICATION REFERENCE INFORMATION

CROSS REFERENCE TO RELATED APPLICATION

The present application is one of two contemporaneously filed applications that share common inventorship, share a common applicant and assignee, and disclose related subject matter. The two applications are: R. Brosch, Maintaining Data Deduplication Reference Information, filed Jun. 3, 2016, application Ser. No. 15/173,323, and R. Brosch, Maintaining I/O Transaction Metadata in Log-With-Index Structure, filed Jun. 3, 2016, application Ser. No. 15/173,289. The related application is herein incorporated by reference in its entirety.

TECHNICAL FIELD

The present disclosure generally relates to data storage and data storage systems including, but not limited to, data storage systems employing deduplication.

BACKGROUND

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, an information handling system may include a variety of hardware and software components that may be configured to process, store, and communicate information and may include one or more computer systems, data storage systems, and networking systems.

An information handling system can be configured in several different configurations ranging from a single, stand-alone computer system to a distributed, multi-device computer system, to a networked computer system with remote or cloud-based information handling resources.

Information handling systems for managing large and frequently accessed and modified databases may employ techniques, features, and data structures to achieve various data storage efficiencies. These efficiencies may include, as non-limiting examples, minimizing or reducing the amount and/or cost of storage capacity required to store and manage a dataset, increasing the amount the size of a dataset that can be achieved in a given amount of physical storage, reducing the time required to search for and/or access a particular record, reducing the risk of lost data as well as the risk of lost compute cycles that may occur when, for example, a power failure occurs while data is being archived or otherwise managed, and so forth.

Data deduplication is an example of a technique used to reduce the amount of storage required to store a dataset. Deduplication aims to achieve data storage efficiencies by detecting and eliminating or reducing the number of duplicated data blocks, duplication in a dataset and eliminating storage of duplicate data patterns. While data deduplication may achieve an increase in data density, i.e., the ratio of data represented to storage required, deduplication introduces its own complexities.

For example, whereas a storage system without deduplication exhibits a 1:1 ratio between stored data and references to the stored data, a deduplicated database may be characterized as exhibiting an N:1 ratio between data references and data patterns, where a data pattern refers to the block's content, i.e., the block's pattern of 1's and 0's. Accordingly, when a reference to a deduplicated data pattern is removed, the corresponding data pattern cannot be removed unless the dataset includes no other valid or active references to the data pattern. Similarly, if a particular data pattern becomes corrupted, all references to the data pattern must be identified. In the absence of reverse mapping information, i.e., mappings, for each data pattern, to each of its references, identifying all instances of references to a data pattern is, as a general rule, infeasible or inefficient since one would have to scan every data reference associated with a dataset every time a reference to a data pattern is removed.

More generally, large and/or frequently accessed and updated databases may need to maintain supporting data structures to ensure reasonable performance for basic operations, including inserting, deleting, querying, and archiving data records, as well as more advanced operations for summarizing one or more aspects of a dataset.

SUMMARY

In accordance with disclosed subject matter, issues associated with the use of particular types of metadata and particular types of data structures to maintain metadata for large datasets are addressed. Although disclosed in the context of a log-with-index (LWI) data structure that features sequential insertion of new records backed by a tree-based index, various disclosed features including, atomic merging of archived data structures, may be applicable in other contexts not specifically disclosed herein. Similarly, although a data deduplication application suitable for use with disclosed LWI data structures and processes is disclosed, other applications may also employ disclosed features.

In accordance with disclosed subject matter, an information handling system may include a processor and a memory or other storage resource, accessible to the processor, that includes processor-executable program instructions that, when executed by the processor, cause the processor to perform storage management operations including maintaining an LWI structure that includes a log for inserting and deleting records, each of which includes a key field indicating a key. The LWI structure further includes an index tree, e.g., a binary tree, for maintaining an index of records in the log.

The LWI structure may maintain the log in HDD or other nonvolatile storage for persistence while insertions and deletions of records in the log may be performed sequentially to ensure adequate performance. The index tree may be maintained in RAM memory or SSD for performance The system may perform log clear operations from time to time in accordance with a log full signal asserted, for example, when the log is full or nearly full. The log clear operations may include committing the log records, ordered in accordance with the index, to a tablet stored in a tablet library that includes previously generated tablets generated in conjunction with previous log full signals. The records in the log and the corresponding index tree data may then be deleted or otherwise released.

The system may maintain a tablet index for accessing records stored in any of the tablets in the tablet library. In accordance with a merge tablet signal asserted periodically or from time to time in response to a tablet merge criteria, the system may merge a first tablet in the tablet library with a second tablet to produce a merged tablet.

Merging the first tablet and the second tablet may include iteratively performing a plurality of atomic merges for each of a plurality of atomic portions of the applicable tablets. Each atomic merge may merge an atomic portion of the first tablet with a corresponding atomic portion of the second tablet to form a corresponding atomic portion of the merged tablet. Each atomic merge may also update a portion of the tablet index corresponding to the atomic portion.

In some embodiments, the size of the atomic portions, i.e., the atomicity of the atomic merges, is defined in terms of keys or key ranges. Key-based atomicity is consistent with the key-ordered structure of the tablets. In some embodiments atomicity may be defined, at least in part, in terms of bytes, e.g., 1 GB or 10 GB atoms. If the tablet is formatted as a plurality of fixed sized pages, e.g., 2 KB pages, the atomic portions may be defined in terms of the number of pages. Atomicity might also be defined as percentage of the tablet, e.g., each atomic portion comprises 1% or 10% of the tablet. A combination of key ranges, number of pages, total bytes, or percentage of table parameters may be used to define the atomic portions in still other embodiments.

To address the risk associated with the potentially massive number of compute cycles required to merge two or more very large tablets, the system may maintain the tablet index nodes in copy-on-write storage wherein updating or otherwise writing to a node preserves the existing node data and creates a copy of the existing data for modification purposes. For example, during an atomic merge covering keys A through F, tablet index nodes associated with nodes A through F or a subset thereof are copy-on-write updated to preserve the existing node data. If the atomic merge does not complete successfully due to a power outage or other cause, the original node data may be restored.

When a merge cycle or an atomic merge cycle is complete, the copy-on-write data for the applicable tablet index nodes may be committed and the pre-existing node data may be released. In addition, the tablet index may include a super root node comprising a parent node of the root nodes for the first, second, and merged tablets. Not until the merge of the entire first and second tablets is complete will the data for the super node be updated to reflect the commitment of the merged data to the tablet library and the corresponding release of the original data.

In some embodiments, each record in the log structure may include a key-value pair comprising a key field indicating a key and a value field containing a value for the indicated key. In other embodiments, the value field may be omitted or may contain a null value.

In addition, each record in the log structure may include a presence bit for distinguishing between insertion transactions and deletion transactions and a sequence field storing a sequence value common to each record in the log. The sequence value may be incremented each time the log is cleared such that the sequence number identifies a particular interval of time defined by the log full signals. The sequence number may be beneficially employed to maintain continuity and/or recognize a disruption in continuity. For example, when the log is cleared and a new tablet is created in the tablet library, the sequence number may be committed to the new tablet. In the event of a power failure or other disruption, the system may use the sequence number to confirm correct status. For example, the sequence number associated with the most recent tablet should exceed the sequence number of the records in the log structure by 1.

In accordance with disclosed data deduplication embodiments, a data deduplication method includes detecting a deduplication transaction comprising a data reference, located at a data reference address, and a data pattern at a data pattern address. A data deduplication key may be determined based on the data reference address and the data pattern address, e.g., by concatenating the data pattern address and the data reference address with the data pattern address as the most significant bits. The resulting data deduplication key may be stored in a key field of a record in the log of a LWI structure. An index of the records in the log may be maintained in a binary index stored in RAM or SSD.

Responsive to detecting a log full signal, the storage controller may perform log clear operations that include: creating, in a tablet library comprising at least one other tablet, a new tablet, storing the logged records, sorted in accordance with the data deduplication keys, to the new tablet, and clearing the log and index tree of all entries. A log sequence number may be maintained by the log, stored in a sequence field of each record in the log, and included in a new tablet when the tablet is written.

From time to time, a tablet merge signal may initiate a merging of a first tablet of the tablet library and a second tablet of the tablet library to form a merged tablet. After the merged tablet is completed and committed to the storage library, the first and second tablets may be released from the tablet library and the corresponding storage locations released.

In at least one embodiment, the data deduplication keys are "value-less", i.e., the records in the log either: do not include a value field corresponding to the key field or include a null value in the value field. Each record may include a presence bit for distinguishing between insertion transactions and deletion transactions and a sequence field storing the previously described sequence value common to each record in the log.

Merging the first tablet and the second tablet may include iteratively performing a plurality of atomic merges for each of a plurality of atomic portions of the applicable tablets. Each atomic merge may include merging an atomic portion of the first tablet with an atomic portion of the second tablet to form an atomic portion of the merged tablet and updating tablet index nodes corresponding to the atomic portion. Boundaries of the atomic portion may be defined in terms of either: a particular range of the keys or a particular number of fixed size tablet pages.

The tablet index may be maintained as copy-on-write data and, in these embodiments, updating the tablet index nodes preserves existing node data until the atomic merge is committed to the merged tablet. The tablet index may include a super root node configured as a parent node of root nodes for the first, second, and merged tablets. In these embodiments, updating the tablet index nodes during an atomic merge preserves the existing node data until the atomic merge is committed to the merged tablet and the atomic portions of the first and second tablets can be released.

The data deduplication method may support extended log query commands including, in at least one embodiment, a range query and a summarize query. The range query retrieves records within a range defined within the query. The summary query may indicate a range of keys, a key mask, and a maximum count, and a query processor may return a result indicating a number of key values within the range of keys subject to the key mask and the maximum count.

The above summary is not intended as a comprehensive description of the claimed subject matter but, rather, is intended to provide an overview of the applicable subject matter. Other methods, systems, software, functionality, features and advantages of the claimed subject matter will be or will become apparent to one with skill in the art upon examination of the following FIGUREs and detailed written description.

BRIEF DESCRIPTION OF THE DRAWINGS

The description of the illustrative embodiments can be read in conjunction with the accompanying FIGUREs. It will be appreciated that, for simplicity and clarity of illustration, elements illustrated in the FIGUREs have not necessarily been drawn to scale. For example, the dimensions of some of the elements may be exaggerated relative to other elements. Embodiments incorporating teachings of the present disclosure are shown and described with respect to the FIGUREs presented herein, in which.

DETAILED DESCRIPTION

Figure 1:
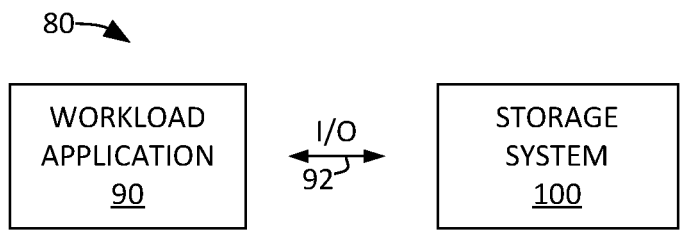
FIG. 1 illustrates an example information handling platform including a storage system.

In the following detailed description, specific exemplary embodiments in which disclosed subject matter may be practiced are described in sufficient detail to enable those skilled in the art to practice the disclosed embodiments. For example, details such as specific method orders, structures, elements, and connections have been presented herein. However, it is to be understood that the specific details presented need not be utilized to practice embodiments of disclosed subject matter. It is also to be understood that other embodiments may be utilized and that logical, architectural, programmatic, mechanical, electrical and other changes may be made within the scope of the disclosed subject matter. The following detailed description is, therefore, not to be taken as limiting the scope of the appended claims and equivalents thereof.

References within the specification to "one embodiment," "an embodiment," "at least one embodiment", or "some embodiments" and the like indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features may be described which may be exhibited by some embodiments and not by others. Similarly, various requirements may be described which may be requirements for some embodiments but not for other embodiments.

It is understood that the use of specific component, device, and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different elements, features, protocols, or concept names are utilized. Thus, each term utilized herein is to be given its broadest interpretation given the context in which that term is utilized.

Disclosed subject matter includes a storage controller with an LWI structure that supports sequential inserts of new transactions into a non-volatile log structure that is backed by a RAM-speed index tree analogous to a log structured merge tree. The LWI structure combines a memory-based index for fast searching and sorting with an NVM-based or HDD-based, sequentially accessed log structure to provide persistence and adequate insert performance. Disclosed LWI structures are tailored for use in one or more data storage and storage system applications including one or more data deduplication applications.

FIG. 1 illustrates an information handling platform 80 including a workload application 90 communicating I/O operations 92 to a storage system 100 that supports metadata and/or deduplication features in accordance with subject matter described herein. While workload application 90 is representative of substantially any application that generates I/O, the metadata and/or data deduplication features disclosed herein may be most useful with respect to workload applications that manage or otherwise interact with large, e.g., terabyte or petabyte, databases and generate a high volume of insert and other transactions.

Storage system 100 is an information handling system that receives and processes I/O operations 92. The storage system 100 of FIG. 1 encompasses hardware, firmware, drivers, and other resources for translating I/O operations 92 into read and write operations targeting one or more types of storage media. Storage system 100 may further include features or resources for maintaining and accessing metadata associated with a corresponding dataset to achieve one or more objectives including, as non-limiting examples, providing a database index structure for faster access and providing data deduplication resources to support data deduplication features.

Although storage system 100 encompasses any one or more suitable types of storage media, the storage media types emphasized in the description of the following figures include hard disk drive (HDD) storage, any of various nonvolatile semiconductor-based storage media including, as non-limiting examples, a solid state drive (SSD), and traditional random access memory (RAM). An SSD generally includes a flash memory array and a storage drive interface integrated within a single device. In at least one embodiment, storage system 100 supports nonvolatile memory (NVM) express (NVMe) SSDs, in which the storage interface is a peripheral component interconnect express (PCIe) interface.

Figure 2A:
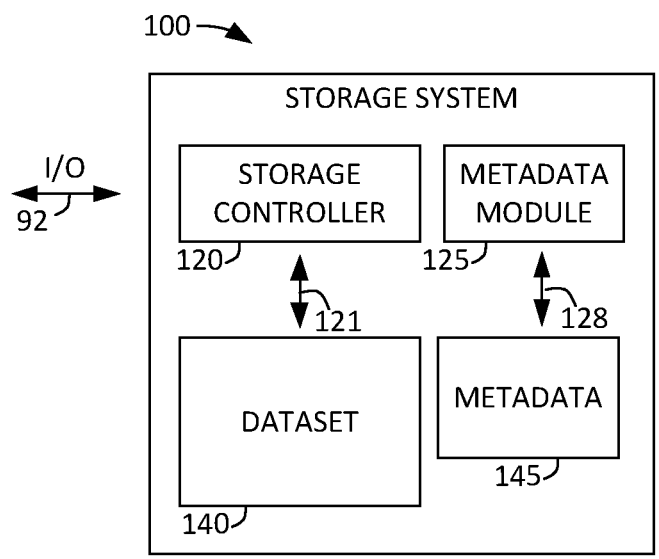
FIG. 2A illustrates a block diagram of logical elements of the storage system of FIG. 1.

FIG. 2A illustrates logical elements of the storage system 100 of FIG. 1. The storage system 100 illustrated in FIG. 2A includes a storage controller 120, a metadata module 125, a dataset 140, and metadata 145. The storage controller 120 receives and processes I/O operations 92 and communicates read/write operations 121 with dataset 140. The storage controller 120 of FIG. 2A interfaces with metadata module 125 to communicate transactions 128 with metadata 145.

The metadata 145 may include substantially any information descriptive of, derived from, or otherwise associated with dataset 140. The metadata 145, illustrated in more detail in FIG. 3 and subsequent figures, may include an LWI structure that includes a sequentially accessed transaction log backed by an index tree to support the generation of key-sorted transaction log tablets. In embodiments that support data deduplication, the key itself may be indicative of or otherwise in accordance with a mapping or other relationship between a data reference and a deduplication data pattern.

Figure 2B:
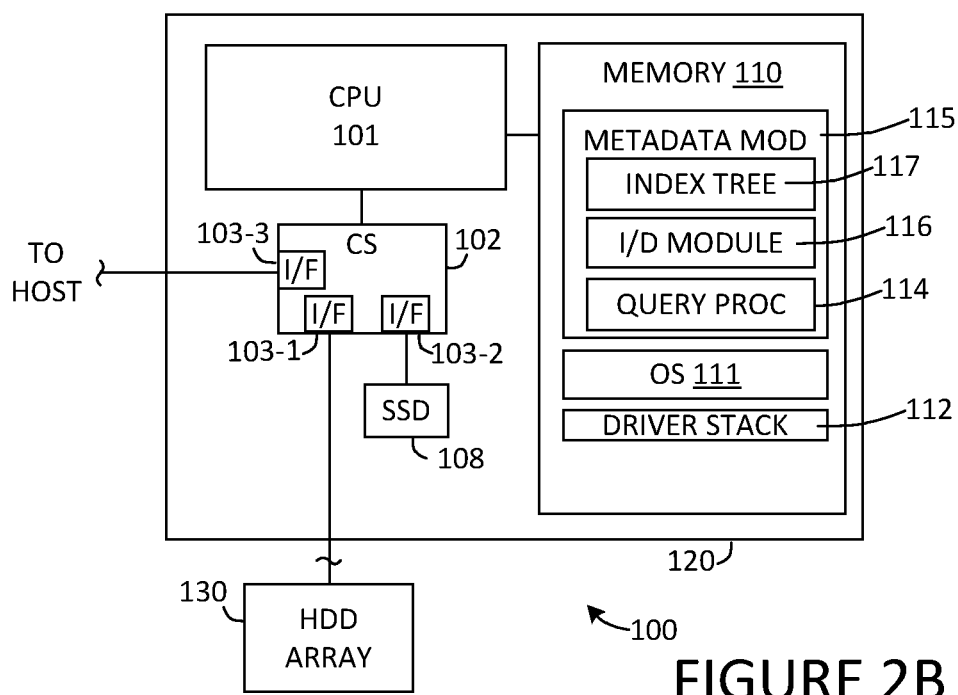
FIG. 2B illustrates a block diagram of structural and functional elements of the storage system of FIG. 1.

As depicted in FIG. 2B, storage controller 120 may be implemented as a special purpose information handling system that includes a central processing unit (CPU) 101 coupled to a memory 110 and a chip set 102. The chip set 102 of FIG. 2B includes a plurality of I/O adapters 103, any one or more of which may support a suitable high-speed serial communication protocol including, as non-limiting examples: PCIe, universal serial bus (USB), IEEE 802.3 (Ethernet), serial AT attachment (SATA), and small computer system interface (SCSI).

The chip set 102 illustrated in FIG. 2B includes a first I/O adapter 103-1 supporting an I/O bus connection to an HDD array 130, a second I/O interface adapter 103-2 supporting an I/O bus connection to an SSD 108, and a third I/O adapter 103-3 supporting an I/O bus connection to a host system (not depicted).

The memory 110 illustrated in FIG. 2B includes CPU-executable program instructions and associated data structures. The program instructions illustrated in FIG. 2B include program instructions that, when executed by CPU 101, provide functionality for an operating system 111 and one or more driver stack(s) 112 for processing I/O operations to/from an application layer program (not depicted in FIG. 2B) and read/write operations to/from storage devices including HDD array 130 and/or SSD 108. Storage driver stack 112 may include, as non-limiting examples, an I/O driver, a file system driver, a volume driver, a device driver, and a RAID driver.

Figure 3:
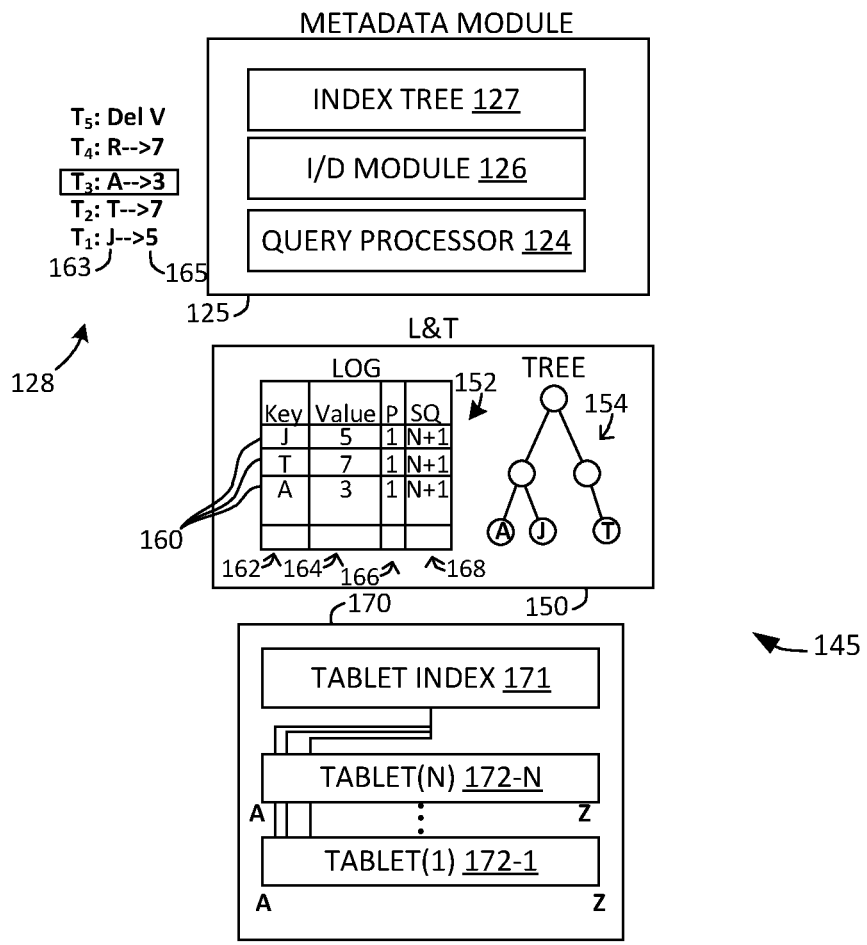
FIG. 3 illustrates a block diagram of a data structure suitable for generating and maintaining metadata for a dataset.

In conjunction with metadata transaction functionality supported by storage controller 100, the memory 110 illustrated in FIG. 2B comprises metadata module instructions 115 for providing the metadata module 125 of FIG. 2A, including query processor instructions 114 and insertion/deletion (I/D) module instructions 116 for maintaining and querying an LWI structure 150 (illustrated in FIG. 3) as well as index tree instructions 117 to maintain a transaction index 154 (illustrated in FIG. 3).

Query processor functionality corresponding to query processor instructions 114 may support commands including: INSERT k→v (insert the mapping k→v into the transaction log), DELETE(k) (remove or invalidate an existing k→v mapping from the transaction log), and QUERY(k), (return the value v associated with a key k if k is present). In addition, disclosed embodiments may support extended metadata commands including, as non-limiting examples, RANGE (k1,k2), which may retrieve all keys in dataset 140 between k1 and k2 inclusive, and SUMMARIZE (k1,k2,c, m) for determining key counts including, for example, the count of all keys, as masked by m, from k1 to k2, to a maximum of c.

FIG. 3 illustrates example metadata 145 including the metadata module 125, an LWI structure 150, and a tablet library 170. Metadata module 125 may include I/D module 126, for inserting records into LWI structure 150 and deleting existing records from LWI structure 150, query processor module 124 for querying records in LWI structure 150 and/or tablet library 170, and index tree module 127 for maintaining transaction index 154.

The LWI structure 150 illustrated in FIG. 3 includes a transaction log 152 and a transaction index 154. The illustrated transaction log 152 includes a plurality of rows or records 160, each of which includes one or more columns or attributes. Each record 160 illustrated in FIG. 3 includes a key attribute 162 for storing a key, a value attribute 164 for storing a value, a presence attribute 166 for storing a presence indicator, and a sequence attribute 168 for storing a sequence value. The presence attribute 166 may indicate whether the corresponding record 160 is valid. For example, storage system 100 may perform a delete transaction by setting the presence attribute 166 of the applicable record.

In at least one embodiment, the transaction log 152 of FIG. 3 is a persistent data record maintained in an accessible HDD or SSD. The transaction log 152 illustrated in FIG. 3 is a sequential log structure in which metadata transactions 128 arriving from metadata module 125 are processed in chronological order. FIG. 3 illustrates an example of a particular set of transactions 128 $T_1$ through $T_5$ occurring in a chronological order, indicated by the subscript, and transaction log 152 is shown reflecting the sequential processing of transactions 128 $T_1$ through $T_3$ with $T_4$ and $T_5$ still unprocessed. The transactions 128 illustrated in FIG. 3 include insertion transactions, indicated by a mapping symbol (-->), each of which includes a key 163, a value 165.

FIG. 3 further illustrates LWI structure 150 including a transaction index 154 configured to provide a key-sorted index of the records 160 in transaction log 152. In at least one embodiment, transaction index 154 is maintained in RAM or SSD to achieve a desirable access performance. The transaction index 154 illustrated in FIG. 3 comprises a tree index and, more specifically, a binary tree index.

The metadata 145 of FIG. 3 includes a tablet library 170 comprising a tablet index 171 and a plurality of two or more tablets 172, 172-1 through 172-N. Whenever transaction log 152 becomes full or nearly full, storage system 100 may generate a log full signal and LWI structure 150 may respond by writing the records 160 in transaction log 152 to persistent storage in tablet library 170. In at least one embodiment, each tablet 172 originates when transaction log 152 is cleared from time to time. In conjunction with transaction index 154, at least some embodiments may write transaction log 152 out to HDD in key-sorted order. The key sorted order is conveyed in FIG. 3 by the "A" to "Z" markings under tablet 172-1 and tablet 172-N.

Figure 4:
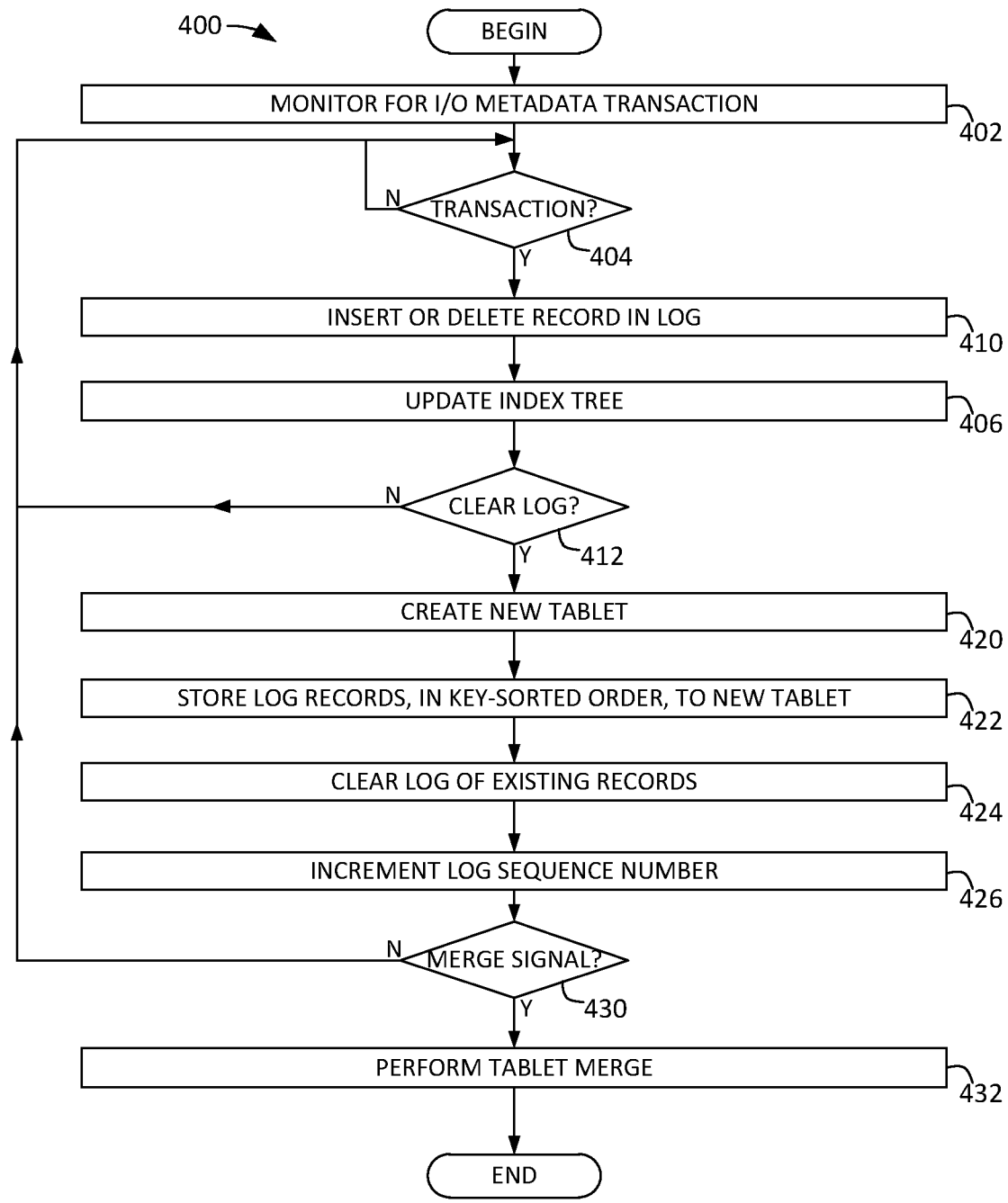
FIG. 4 illustrates a flow diagram of a data storage method.

Referring now to FIG. 4, a flow diagram of a metadata method 400, performed by storage system 100 or a resource of storage system 100, for employing a LWI structure to maintain and query metadata associated with a dataset is illustrated. In the metadata method 400 of FIG. 4 the applicable system or resource monitors(operation 402) for an I/O metadata transaction, an example of which is the metadata transaction 128 illustrated in FIG. 2. When a metadata transaction is detected (operation 404), the transaction is inserted or otherwise incorporated (operation 406) into the transaction log, e.g., the transaction log 152 of FIG. 2, and the index tree is updated (operation 410) to reflect the newly inserted transaction.

In at least some embodiments, the transaction log is maintained in nonvolatile storage and transactions are incorporated into the transaction log sequentially, to insure adequate insert/delete performance. The index tree may be maintained in RAM or in an SSD and is used to maintain an index of the keys stored in the transaction log.

The metadata method 400 of FIG. 4 continues to monitor for transactions and to incorporate any transactions detected until a log full signal is detected (operation 412). The storage system 100 may generate a log full signal based upon any of various criteria determined based, at least in part, on the number of transactions stored in the transaction log, the amount of time since the last assertion of the log full signal, or a combination of both. In at least one embodiment, the transaction log is a fixed-size data structure and the log full signal is asserted based solely or partially on the number of records in the transaction log, e.g., log full signal is asserted upon detecting that the transaction log is filled to capacity or that the number of records stored in the transaction log exceeds a threshold value. In some embodiments, the log full signal may be periodically or non-periodically asserted even if the number of transaction log records does not exceed the applicable threshold.

When a log full signal is generated, the metadata method 400 of FIG. 4 creates (operation 420) a new tablet, stores (operation 422) the transaction log records to the new tablet, and clears (operation 424) the transaction log. In conjunction with the transaction index 154, the transaction log records are stored to the tablet in key-sorted order, e.g., from lowest key to highest key or vice versa. The clearing of the transaction log may include deleting or otherwise releasing all transaction log records and all node data in the index tree. In embodiments that employ a transaction log sequence number, the transaction log sequence number may be incremented (operation 426) in response to all or some assertions of the log full signal.

The metadata method 400 illustrated in FIG. 4 monitors (operation 430) for a tablet merge signal and performs a tablet merge (operation 432) in response to assertions of the tablet merge signal. The tablet merge 432 may include the creation of a storage space for a merged tablet followed by the merging of two or more existing tablets. In at least some embodiments, tablets are generally treated as read-only data structures once created. However, because the tablets represent a chronological sequence of key-sorted transaction log snap shots and because keys can be deleted or overwritten, tablet data may become stale over time. To maintain the relevance of the records in the tablet library and prevent an index that includes an ever-increasing number of decreasingly significant tablet layers, two or more tablets may be merged, with any conflicting entries being resolved in favor of the newer tablet.

Tablet merges may occur periodically or based upon one or more other or additional criteria. The size of a tablet resulting from the merging of two existing tablets can range from a minimum size, equal to the size of the more recent tablet, to a maximum size, equal to the sum of the two tablets. Assuming that any two newly created tablets are of approximately the same size and a tablet merge occurs between two existing tablets each time a new tablet is created, i.e., whenever the number of tablets equals three the two oldest tablets are merged, it can be seen that the size of the merged tablet may grow monotonically over time.

To prevent an unchecked drift of tablet size over time, any one of various suitable operations may be included within metadata method 400. For example, if the size of the tablet library, excluding the oldest tablet, exceeds a particular threshold, merge operations are performed. In another example, a time stamp may be associated with each tablet. If the age of the oldest tablet exceeds a particular threshold, merge operations are performed.

Figure 5:
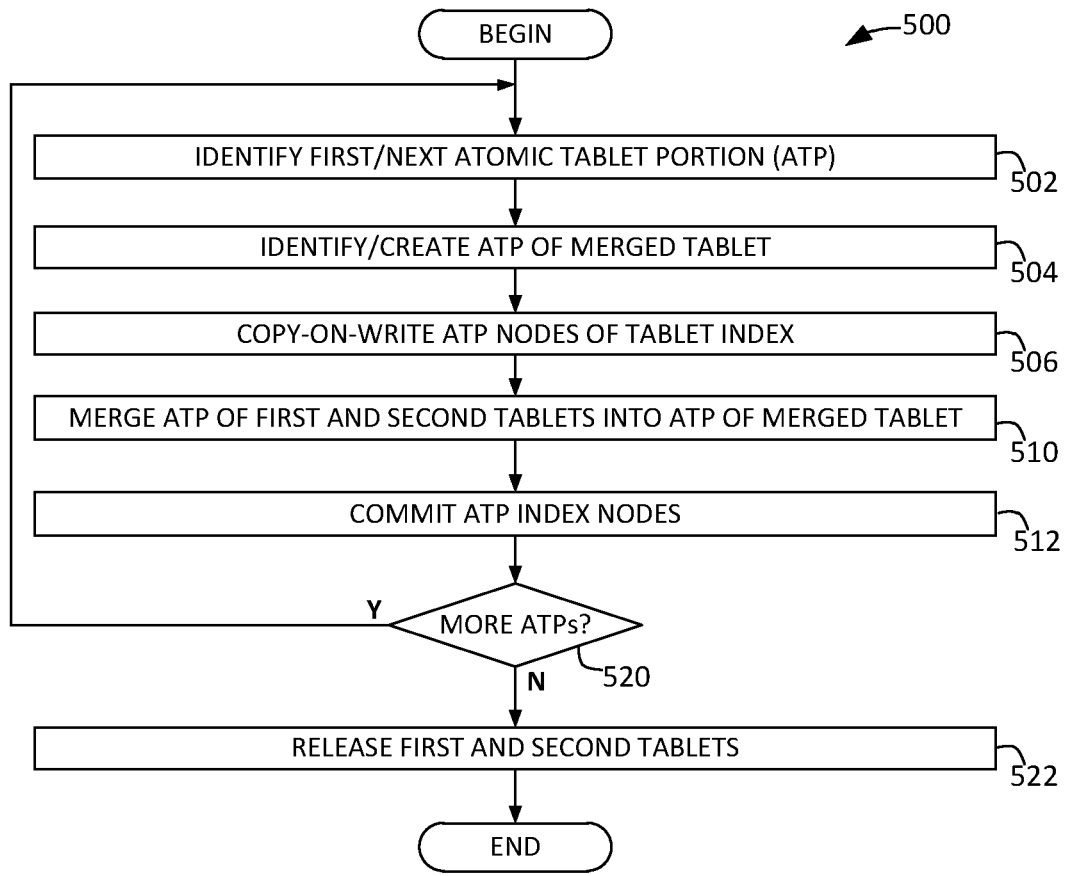
FIG. 5 illustrates a flow diagram of an atomic merge of two storage tablets.

FIG. 5 illustrates an example of the tablet merge operation 432 of FIG. 4. The tablet merge operation 432 of FIG. 5 addresses a concern particularly applicable in the context of massive datasets, where tablet sizes of terabytes or petabytes may be common. Merging two or more very large HDD tablets can require a massive number of compute cycles. As the amount of time required to convert a data set from one state to another state increases, the cost associated with a failure occurring during the transition increases.

To reduce the risk associated with losing a potentially enormous amount of computational "work-in-progress" during a tablet merge, the tablet merge operation 432 depicted in FIG. 5 comprises a series of atomic merges, i.e., merges of atomic portions of two or more tablets. By performing the tablet merge as a series of atomic merges, the risk associated with a power failure or other fatal disruption is limited to the computational risk associated with each atomic merge. Thus, the risk can be controlled by adjusting the atom size, i.e., the portion of a tablet merged during any given atomic merge.

Atom sizes may be chosen in accordance with any one or more of various suitable parameters. For example, because the tablets contain records arranged in key sorted order, the atomicity of each merge may be defined according to a range of keys. Alternatively, if the tablets are formatted into fixed-size pages when stored, atomicity might be defined in terms of physical pages, e.g., each atomic merge merges N physical pages. Defining atomicity in terms of physical pages may, however, result in some duplicate entries in the merged tablet since page ranges and key ranges are not inherently aligned.

The tablet merge operation 432 illustrated in FIG. 5 includes identifying (block 502) the first or next successive atomic portion (ATP) to be merged, whether based on key ranges, physical page ranges, a combination of both, or otherwise.

Whenever the distribution of keys within a tablet is non-uniform, a key-defined atomicity may result in some atomic merges that process more records than others. Similarly, if the distribution of keys in a first tablet differs from the distribution of keys in a second tablet, an atomic merge may require more time to complete since fewer keys in the older tablet can be discarded due to the presence of the same key in the newer tablet. Some embodiments may impose page-based or other size-based constraints on the size of an atom to achieve a more uniform atomic risk, i.e., the risk of re-performing an atomic merge. Once the first or next successive ATP is defined, the tablet merge operation 432 of FIG. 5 allocates (operation 504) storage space for the ATP of the merged tablet.

As described below with respect to FIG. 6 below, storage system 100 may maintain an index for the tablet library to improve query performance. To accommodate atomic merging as described herein, the nodes of this tablet index may be implemented as copy-on-write nodes, in which an attempt to write node data stores the write value in a different storage location, thereby preserving the original data. In this manner, the tablet index nodes may be modified, e.g., to index records in the merged tablet rather than records in the source tablets, while an atomic merge is in progress without committing the original node data. If a failure occurs while an atomic merge is in progress, the pre-failure stat of the tablet index can be restored. Accordingly, the tablet merge operation 432 illustrated in FIG. 5 includes a copy-on-write operation(operation 506) in which source tablet index nodes associated with the current ATP are duplicated and modified.

The source tablet ATPs are then merged (operation 510) into the ATP of the merged tablet. The basic merge operation may comprise a prioritized union of the source ATPs in which duplicate records are discarded and any conflicting records are resolved in favor of the more recent record. In this manner, the merged tablet contains all the records included in the newer tablet plus any record in the older tablet for a key not found in the newer tablet. After the entire ATP of the source tablets has been merged into the corresponding ATP of the merged tablet, the tablet index nodes that were previously stored to copy-on-write storage locations can be committed (operation 512) to the tablet index and the original data can be released.

The tablet merge operation 432 illustrated in FIG. 5 determines (operation 520) whether any ATPs remain and, if so, returns to the identification of the next ATP in operation 502. When all ATPs have been processed, the tablet index nodes of the source tablets and the source tablets themselves can be released (operation 522) in their entirety, at which point the merged tablet is fully committed.

Figure 6:
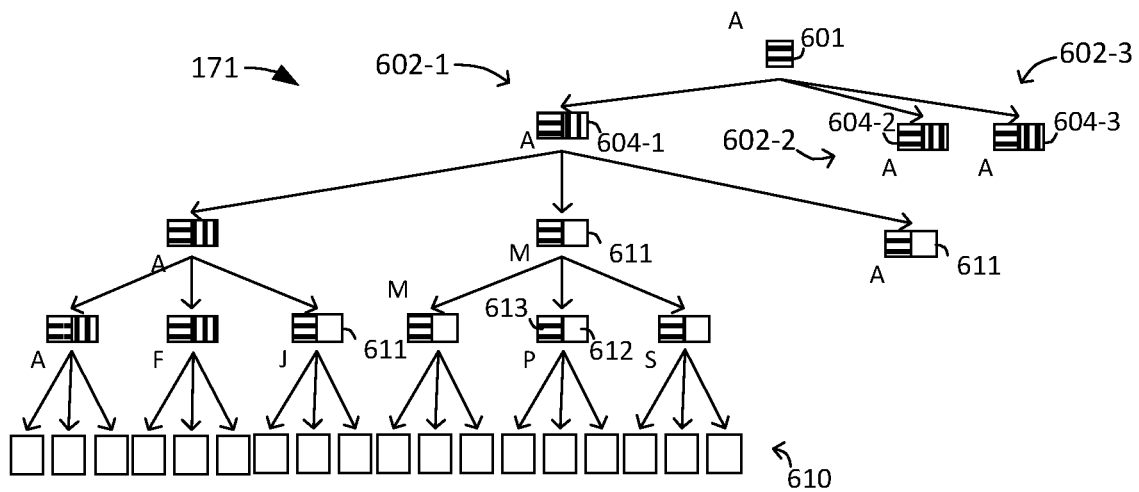
FIG. 6 illustrates a block diagram of a tablet index suitable for a disclosed tablet library.

FIG. 6 illustrates a tablet index 171 suitable for performing the atomic merging described with respect to FIG. 5. The tablet index 171 illustrated in FIG. 6, which illustrates the merging of two source tablets, includes three multi-tiered node trees 602, including node trees 602-1 and 602-2 corresponding to the first and second source tablets and a node tree 602-3 for the merged tablet. Each node tree 602 includes a root node 604 and two or more generations of descendant nodes terminating in a set of leaf nodes 610.

The tablet index 171 of FIG. 6 includes a super node 601 that has each of the three root nodes 604 as its child nodes. In this manner, super node 601 provides a single point of synchronization for the tablet index, encompassing the source nodes as well as the target node. In addition, as described above each individual tablet index node 611 is a copy-on-write data structure that includes a committed block 612 and a modified block 613. Either of the blocks may serve as the committed block and the node may include additional metadata not illustrated in FIG. 6 to indicate at any given time which of the two blocks contains committed data. During an atomic merge operation, the storage system 100 may index the tablet library using the data in the modified block of the applicable tablet index node until the entire ATP is merged, at which point the copy-on-write data can be committed all the way up the node tree to super node 601. Once modified data has been committed through to the super nodes 601, the previously committed data may be released.

Figure 7:
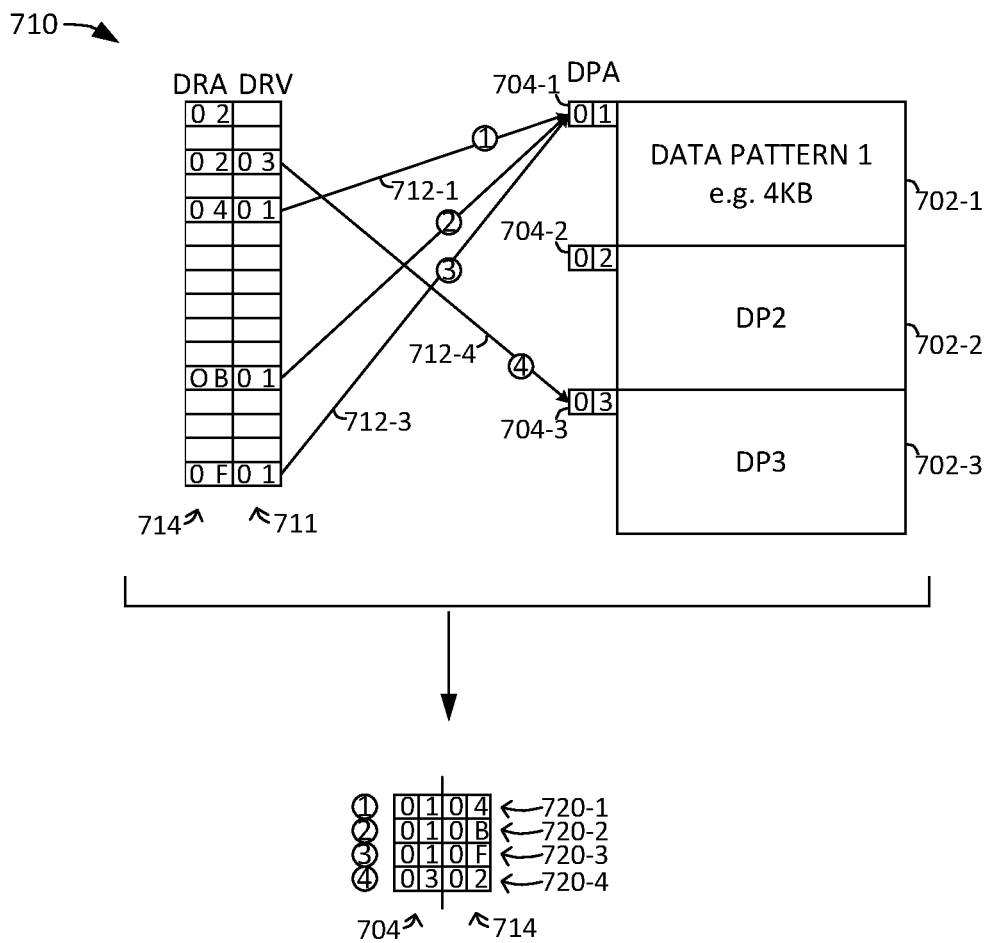
FIG. 7 illustrates a generation of keys suitable for use in a data deduplication application.

FIG. 7 illustrates a key generation feature suitable for use with a data deduplication application of the log and tree structure analogous to the metadata 145 illustrated in FIG. 3. The key generation technique illustrated in FIG. 7 generates data deduplication keys 720 that beneficially indicate an association between a data reference and its corresponding data pattern.

Data deduplication keys 720 may be beneficially used in storage systems 100 that support data deduplication. Data deduplication support may include elements (not depicted in FIG. 7) for performing a hashing algorithm on arriving data blocks and maintaining a library of the hash values. The hash value of each newly arriving data block can be queried against the library hash values. If a match is detected and verified, a reference to the existing data block is stored instead of storing a second copy of the data block itself. An exemplary data deduplication technique is more fully described in R. Brosch, Data Deduplication with Augmented Cuckoo Filters, U.S. patent application Ser. No. 15/431,938, filed Feb. 11, 2016, incorporated by referenced herein.

FIG. 7 illustrates a group of data blocks 702, including data blocks 702-1, 702-2, and 702-3. Each data block 702 may represent a fixed-size or variable-sized block of data, referred to herein as the data block's pattern, which may comprise the data block itself or a hash of the data block depending upon how the data deduplication is implemented. FIG. 7 further illustrates set of references 712 to the illustrated data pattern addresses 704. In particular, FIG. 7 illustrates a data reference memory 710 that includes a set of data deduplication references 712, each of which includes a data reference value 711 and a corresponding data reference address 714.

FIG. 7 illustrates an example configuration that employs, for the sake of simplicity, an 8-bit data pattern address and an 8-bit data reference address. The number of bits used for either of these two addresses is an implementation detail and other embodiments may use other values. FIG. 7 further illustrates the use of 4 KB data patterns 702, but other embodiments may use smaller or larger data blocks.

FIG. 7 illustrates four data deduplication references 712, including three data deduplication references 712-1, 712-2, and 712-3, containing references to data pattern 1 702-1, and a single data deduplication reference 712-4 containing a reference to data pattern address 704-3. Specifically, data reference addresses 0x05, 0x11, and 0x15 of data reference memory 710 are each associated with data pattern address 0x01, where data pattern address 0x01 corresponds to the first data pattern 702-1. Data reference address 0x02 is associated with data pattern address 0x03, where data pattern address 0x03 corresponds to third data pattern 702-3.

For at least some purposes useful in maintaining data deduplication metadata, it may be beneficial to configure a key that, when sorted, readily reveals the number of data deduplication references 712 to any particular data pattern 702. The data deduplication keys 720-1 through 720-4 corresponding to data deduplication references 712-1 through 712-4 respectively are produced or obtained by concatenating the applicable data reference address 714 and the applicable data pattern address 704 with the data pattern address 704 stored in the most significant bits and the data reference address 714 stored in the least significant bits. Other embodiments may produce or obtain data deduplication keys 720 differently.

In at least one embodiment, each data deduplication key 720 represents a key 162 in the log 152 of FIG. 3. Each of the data deduplication keys 720 illustrated in FIG. 7 thus contains a reference to the data pattern address 704 and a reference to the data reference address 714 for each data deduplication reference 712. Moreover, because the data pattern address 704 occupies the most significant bits of the applicable data deduplication key 720, a numerically-ordered sorting of the keys 162 facilitates reference counts and other data pattern based characterizations of the set of keys 162.

Accordingly, the data deduplication keys 720 illustrated in FIG. 7 in this manner beneficially support extended query operations that may be useful in data deduplication operations. For example, when a set of keys 162 generated in accordance with the data deduplication keys 720 is arranged in key-sorted order, the keys 162 readily reveal the number of references to any particular data pattern 702, i.e., deduplication reference counts, including data patterns 702 which are not referenced by any data reference value 711 in data reference memory 710. Similarly, a key-sorted list of keys 162 facilitates the process of identifying keys associated with an atomic tablet merge as described above. Every time another reference to a data pattern is detected in the dataset, the applicable reference count can be incremented. Whenever a reference to a data pattern is removed, the reference count may be decremented. When the reference count for a specific data pattern decrements to zero, this indicates that there is no reference to this pattern and the data pattern can therefore be released.

The data deduplication references 720 illustrated in FIG. 7 may be inserted into transaction log 152 of FIG. 3 and managed in conjunction with the transaction index 154 and the tablet library 170 illustrated in FIG. 3. In any such embodiment, the value attribute 164 illustrated in transaction log 152 of FIG. 3 may be omitted, ignored, or configured to reflect a null value because the data deduplication keys 720 have no corresponding value data. In other respects however, data deduplication keys 720 may be indexed in the transaction index 154 and written out to tablet library 170 as tablets, where the tablets may be merged from time to time as described above.

Any one or more processes or methods described above, including processes and methods associated with the FIG. 4 and FIG. 5 flow diagrams, may be embodied as a computer readable storage medium or, more simply, a computer readable medium including processor-executable program instructions, also referred to as program code or software, that, when executed by the processor, cause the processor to perform or otherwise result in the performance of the applicable operations.

A computer readable medium, which may also be referred to as computer readable memory or computer readable storage, encompasses volatile and non-volatile media, memory, and storage, whether programmable or not, whether randomly accessible or not, and whether implemented in a semiconductor, ferro-magnetic, optical, organic, or other suitable medium. Information handling systems may include two or more different types of computer readable medium and, in such systems, program code may be stored, in whole or in part, in two or more different types of computer readable medium.

Unless indicated otherwise, operational elements of illustrated or described methods may be combined, performed simultaneously, or performed in a different order than illustrated or described. In this regard, use of the terms first, second, etc. does not necessarily denote any order, importance, or preference, but may instead merely distinguish two or more distinct elements.

Program code for effecting described operations may be written in any appropriate combination of programming languages and encompasses human readable program code including source code as well as machine readable code including object code. Program code may be executed by a general purpose processor, a special purpose processor, including, as non-limiting examples, a graphics processor, a service processor, or an embedded processor or controller.

Disclosed subject matter may be implemented in any appropriate combination of software, firmware, and hardware. Terms including circuit(s), chip(s), processor(s), device(s), computer(s), desktop(s), laptop(s), system(s), and network(s) suggest at least some hardware or structural element(s), but may encompass non-transient intangible elements including program instruction(s) and one or more data structures including one or more databases.

While the disclosure has been described with reference to exemplary embodiments, it will be understood by those skilled in the art that the disclosure encompasses various changes and equivalents substituted for elements. Therefore, the disclosure is not limited to the particular embodiments expressly disclosed, but encompasses all embodiments falling within the scope of the appended claims.

As used herein, the singular forms "a", "an" and "the" are intended to include the plural forms as well, unless the context clearly indicates otherwise. It will be further understood that the terms "comprises" and/or "comprising," when used in this specification indicate the presence of stated features, operations, elements, and/or components, but does not preclude the presence or addition of one or more other features, operations, elements, components, and/or groups thereof.

What is claimed is:

1. A data deduplication method, comprising:
    detecting a deduplication transaction corresponding to a reference address indicated in an I/O transaction, wherein the reference address is associated with a deduplicated data pattern and wherein the deduplication transaction indicates the reference address and a pattern address, wherein the pattern address indicates a storage address of the deduplicated data pattern;
    determining a deduplication key for the deduplication transaction, wherein the deduplication key includes a more significant bits portion and a less significant bits portion and wherein the more significant bits portion is indicative of the pattern address and the less significant bits portion is indicative of the reference address;
    storing the deduplication key in a key field of a record in a transaction log of a log-with-index structure, wherein the transaction log comprises a sequential storage structure and wherein storing the deduplication key comprises storing the deduplication key in the sequential storage structure to reflect a chronological order in which deduplication transactions are processed;
    maintaining a transaction index of the log-with-index structure, wherein the transaction index indicates a key-sorted order of records in the transaction log, wherein the key-sorted order reflects an ordering of the records in accordance with their corresponding pattern addresses;
    responsive to detecting a log full signal, performing log clear operations comprising:
    creating, in a tablet library comprising at least one other tablet, a new tablet;
    storing the records, sorted in accordance with the deduplication keys, to the new tablet; and
    clearing all of the records in the transaction log; and
    responsive to a tablet merge signal, merging a first tablet of the tablet library and a second tablet of the tablet library to form a merged tablet and releasing the first tablet and the second tablet from the tablet library.

2. The data deduplication method of claim 1, wherein the records in the transaction log either:
    do not include a value field corresponding to the key field; or
    include a null value in the value field.

3. The data deduplication method of claim 1, wherein each record includes:
- a presence bit for distinguishing between insertion transactions and deletion transactions; and
- a sequence field storing a sequence value common to each record in the transaction log; and
- wherein clearing the transaction log includes incrementing the sequence value.

4. The data deduplication method of claim 1, further comprising:
- maintaining the transaction log in persistent storage; and
- maintaining the transaction index in memory.

5. The data deduplication method of claim 1, wherein merging the first tablet and the second tablet comprises iteratively performing a plurality of atomic merges for each of a plurality of atomic portions of the first and second tablets, each atomic merge comprising:
- merging an atomic portion of the first tablet with an atomic portion of the second tablet to form an atomic portion of the merged tablet; and
- updating tablet index nodes corresponding to the atomic portion.

6. The data deduplication method of claim 5, wherein atomic portion boundaries are defined in terms of either:
- a particular range of deduplication keys; or
- a particular number of fixed size tablet pages.

7. The data deduplication method of claim 5, further comprising:
- maintaining the tablet index nodes as copy-on-write data wherein said updating of the tablet index nodes preserves node data.

8. The data deduplication method of claim 7, wherein the tablet index nodes include a super root node comprising a parent node of root nodes for the first tablet, the second tablet, and the merged tablet, wherein said updating of the table index nodes preserves node data until each atomic merge is committed to the merged tablet and the atomic portions of the first and second tablets are released.

9. The data deduplication method of claim 1, wherein the log full signal is asserted responsive to utilization of the transaction log exceeding a threshold selected from:
- a percentage utilization threshold;
- a record count threshold; and
- a byte size threshold.

10. The data deduplication method of claim 1, further comprising:
- responsive to receiving a range query indicating a range of keys, generating a query result indicative of the range of keys indicated in the range query.

11. The data deduplication method of claim 1, further comprising, responsive to receiving a summary query indicating a range of keys, a key mask, and a maximum count, returning a result indicating a number of key values within the range of keys subject to the key mask and the maximum count.

12. An information handling system, comprising:
- a processor;
- a memory, accessible to the processor, wherein the memory includes processor executable instructions that, when executed by the processor, cause the information handling system to perform operations comprising:
  - detecting a deduplication transaction corresponding to a reference address indicated in an I/O transaction, wherein the reference address is associated with a deduplicated data pattern and wherein the deduplication transaction indicates the reference address and a pattern address wherein the pattern address indicates a storage address of the deduplicated data pattern;
  - determining a deduplication key for the deduplication transaction, wherein the deduplication key includes a more significant bits portion and a less significant bits portion and wherein the more significant bits portion is indicative of the pattern address and the less significant bits portion is indicative of the reference address;
  - storing the deduplication key in a key field of a record in a transaction log of a log-with-index structure, wherein the transaction log comprises a sequential storage structure and wherein storing the deduplication key comprises storing the deduplication key in the sequential storage structure to reflect a chronological order in which deduplication transactions are processed;
  - maintaining a transaction index of the log-with-index structure, wherein the transaction index indicates a key-sorted order of records in the transaction log, wherein the key-sorted order reflects an ordering of the records in accordance with their corresponding pattern addresses;
  - responsive to detecting a log full signal, performing log clear operations comprising:
    - creating, in a tablet library comprising at least one other tablet, a new tablet;
    - storing the records, sorted in accordance with the deduplication keys, to the new tablet; and
    - clearing all of the records in the transaction log; and
  - responsive to a tablet merge signal, merging a first tablet of the tablet library and a second tablet of the tablet library to form a merged tablet and releasing the first tablet and the second tablet from the tablet library.

13. The information handling system of claim 12, wherein the records in the transaction log either:
- do not include a value field corresponding to the key field; or
- include a null value in the value field.

14. The information handling system of claim 12, wherein each record includes:
- a presence bit for distinguishing between insertion transactions and deletion transactions; and
- a sequence field storing a sequence value common to each record in the transaction log; and
- wherein clearing the transaction log includes incrementing the sequence value.

15. The information handling system of claim 12, wherein merging the first tablet and the second tablet comprises iteratively performing a plurality of atomic merges for each of a plurality of tablet portions, each atomic merge comprising:
- merging an atomic portion of the first tablet with an atomic portion of the second tablet to form an atomic portion of the merged tablet;
- updating a tablet index corresponding to the atomic portion; and
- wherein the atomic portion comprises a tablet portion corresponding to a particular range of deduplication keys.

16. The information handling system of claim 12, wherein the operations include:
- responsive to receiving a range query indicating a range of keys, retrieving all keys within the range of keys indicated in the range query.

17. The information handling system of claim 12, wherein the operations include:
- responsive to receiving a summary query indicating a range of keys, a key mask, and a maximum count, returning a result indicating a number of key values within the range of keys subject to the key mask and the maximum count.

* * * * *